United States Patent [19]

Liu et al.

[11] Patent Number: 5,536,950
[45] Date of Patent: Jul. 16, 1996

[54] HIGH RESOLUTION ACTIVE MATRIX LCD CELL DESIGN

[75] Inventors: Michael S. Liu, Bloomington; Ka-Lun Lo, New Hope, both of Minn.; Kalluri R. Sarma, Mesa, Ariz.

[73] Assignee: Honeywell Inc., Minneapolis, Minn.

[21] Appl. No.: 331,315

[22] Filed: Oct. 28, 1994

[51] Int. Cl.$^6$ ................................................. H01L 33/00
[52] U.S. Cl. .................. 257/59; 257/72; 257/91; 257/99; 359/59; 359/88
[58] Field of Search ........................ 257/59, 72, 99, 257/91; 359/58, 59, 88, 55

[56] References Cited

U.S. PATENT DOCUMENTS

| | | | |
|---|---|---|---|
| 5,019,002 | 5/1991 | Holmberg | 445/24 |
| 5,041,823 | 8/1991 | Johnson et al. | 340/784 |
| 5,095,304 | 3/1992 | Young | 340/766 |
| 5,110,748 | 5/1992 | Sarma | 437/51 |
| 5,126,865 | 6/1992 | Sarma | 359/59 |
| 5,162,931 | 11/1992 | Holmberg | 359/54 |
| 5,168,074 | 12/1992 | Sarma | 437/51 |
| 5,207,749 | 4/1993 | Zavracky et al. | 359/59 |
| 5,256,562 | 10/1993 | Vu et al. | 437/86 |
| 5,281,840 | 1/1994 | Sarma | 257/351 |
| 5,286,983 | 2/1994 | Sakamoto et al. | 359/88 X |
| 5,323,042 | 6/1994 | Matsumoto | 257/59 X |
| 5,434,433 | 7/1995 | Takasu et al. | 257/59 |

FOREIGN PATENT DOCUMENTS

| | | | |
|---|---|---|---|
| 52124769 | 6/1987 | Japan | 257/59 |

OTHER PUBLICATIONS

"Single Transistor Latch in SOI MOSFET's", by C. E. Chen, IEEE Electron Device Letters, vol. 9, No. 12, Dec. 1988, pp. 636–638.

"The flat panel's future", Kenneth I. Werner (contributing editor), IEEE Spectrum, Nov., 1993, pp. 18–29.

"P–70: A 6.3 Mpixel AMLCD", by R. Martin, et al, SID 93 Digest, pp. 704–707.

"LCDs Run Away with Military Flat Panel Market", by Sheila Galatowitsch, Defense Electronics, May 19993, pp. 25–31.

"A Revolution is in Store for Flat–Panel Displays", by Jack Shandle, Electronic Design, Apr. 1993, pp. 59–73.

"A 0.7–in. Fully Integrated Poly–Si CMOS LCD with Redundancy" by Hayashi, et al, Proceedings of the SID, vol. 32/4, 1991, pp. 297–300.

"5.7 Late–News Papers: Single–Crystal Silicon Transmissive AMLCD", J. P. Salerno, et al, SID 92 Digest, pp. 63–66, 1992.

"29.3: A High Aperture Ratio TFT–LCD with a Shield–Electrode Structure", by T. Ueda, et al, SID 93 Digest, pp. 739–742, 1993.

*Primary Examiner*—William Mintel
*Attorney, Agent, or Firm*—Gregory A. Bruns

[57] ABSTRACT

A transistor panel used for active matrix display devices includes islands of single crystal silicon formed on a transparent quartz substrate and arranged in rows and columns, with an NMOS transistor formed in each island. Each transistor includes source, drain and channel regions and an isolated pixel reference voltage region. A silicon body tie connects the channel region to the pixel reference voltage region and acts as a current sink for unwanted carriers thereby greatly increasing the snapback voltage. A metallization extends to each transistor and is in contact with each reference voltage region to form a body tie buss. The portion of the body tie that overlaps the pixel electrode may be sized to provide a storage capacitor for improved display performance. The unique body tie design obviates the need for a separate light shield layer, provides a dramatically increased aperture ratio and is compatible with normal high temperature silicon processes.

14 Claims, 7 Drawing Sheets

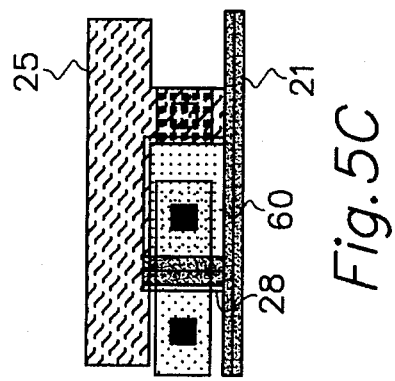
Fig.5A
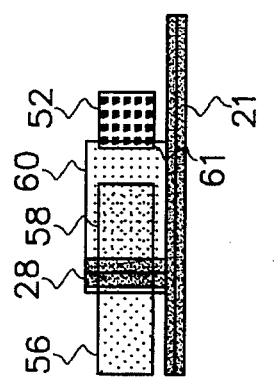
Fig.5B
Fig.5C
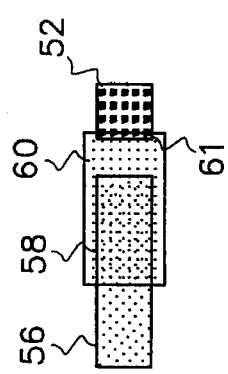
Fig.5D
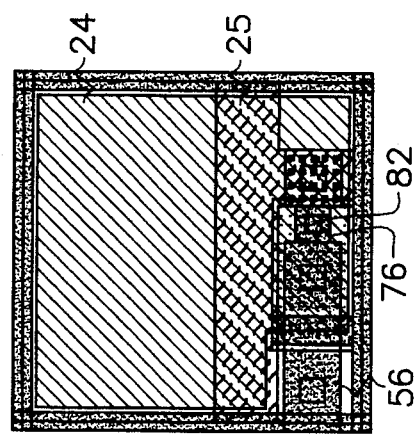
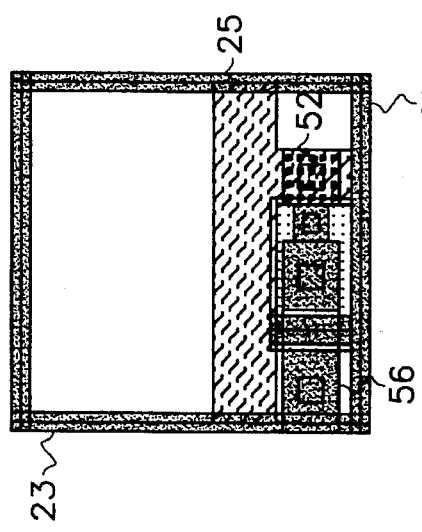
Fig.5E

HIGH RESOLUTION ACTIVE MATRIX LCD CELL DESIGN

BACKGROUND OF THE INVENTION

The present invention relates generally to liquid crystal displays (LCDs) and specifically to active matrix liquid crystal displays (AMLCDs), and to AMLCD's having integrated row and column drivers.

Presently, AMLCDs are being developed and used for a wide variety of flat panel display and projection light valve display applications. Flat panel AMLCDs are of interest for a number of commercial, industrial, military and space applications because of their potential for reduced weight, volume and power consumption, and enhanced resolution and reliability compared to the conventional CRT displays. Similarly, light valve AMLCDs are of interest for a variety of helmet and head mounted displays and large area projection displays because of their potential for compactness, high resolution, high brightness and low power. Generally, either amorphous silicon (a-Si) or polysilicon (poly-Si) thin film transistor (TFT) technologies are used in the fabrication of the prior art AMLCDs. An a-Si TFT has a low mobility (approximately 1 $Cm^2/V$. Sec.) and hence does not allow fabrication of integrated row and column drivers for the AMLCDs. Poly-Si TFTs result in a lower pixel aperture ratio, and display performance degradation due to higher threshold voltage, higher leakage currents and high defect densities. One of the important factors influencing the power requirement of the AMLCDs is the pixel aperture ratio. When the pixel aperture ratio is small, it requires the use of a brighter backlight which consumes more power for achieving a display with a given brightness. For many applications, particularly portable devices such as displays for notebook computers, minimizing the power consumption is very important. Unfortunately, the present high resolution AMLCD pixel designs result in a very low aperture ratio, in the typical range of 30–35%.

Single silicon (SC-Si) transistors, due to their high mobility (electron mobility approximately 600 $Cm^2/V$. Sec.), 0 low threshold voltage and low leakage currents offer several advantages for the AMLCDs. SC-Si allows fabrication of CMOS integrated drivers required for high resolution displays using a simple architecture, resulting in much fewer external interconnects between the integrated drivers and the display controller, thus achieving a compact and high reliability display.

However, conventional active matrix pixel/transistor designs using SC-Si results in reduced operating voltage capacity due to "voltage snapback" as a result of the floating body and the parasitic bipolar transistor operation. The body region of metal-oxide semiconductor (MOS) circuits on silicon on insulator (SOI) substrates is typically floating. SOI MOSFETs with a floating body exhibit a kink, or increase in drain current, in the saturation region of the $I_D$ vs. $V_{DS}$ characteristic due to a reduction of the MOSFET threshold voltage which occurs when the majority carriers, generated at the drain by impact ionization, forward bias the body to source junction. A sufficiently high body to source forward bias can cause a rapid increase in drain current and result in premature drain to source breakdown, causing the transistor to latch up. The voltage at which this occurs is referred to as the snapback voltage. P-channel SOI devices are generally free of kink effect, and the breakdown voltage problems because the coefficient of electron-hole pairs generation by the energetic holes is much lower and the minority carrier (hole) lifetime is much shorter compared to the NMOS devices. As a result, body tie is not generally important for PMOS devices.

While there are some benefits to using SC-Si TFTs in AMLCDs using conventional designs when compared to using polysilicon TFTs, one drawback is that the display operating voltage is limited by the snapback voltage of the NMOS transistor. This snapback voltage is typically 7 volts or less. Floating body effects can be alleviated by keeping the body region at a fixed potential. A body contact or body tie to an SOI MOSFET has to be formed on the same dielectrically isolated island and isolated from the drain region by a reversed bias junction. For an efficient AMLCD design, it is desirable to have a display operating voltage (snapback voltage) of at least 10V, and preferably 15V.

In addition, it is desirable to achieve a high aperture ratio in the AMLCD. This aperture ratio is influenced by the TFT and the body tie design.

Another problem with the conventional pixel TFT design is the method used to suppress the problems due to the semiconductor (SC-Si) photoconductivity. Incident light creates electron-hole pairs in the channel region of the transistor. If the body of the transistor is left floating, the electron-hole pairs diffuse to the source and drain regions, and manifest as photocurrents. In the conventional design, an opaque light shield, typically a metal or black pigment layer, is fabricated on top of the TFT. This makes the process more complex and increases cost.

Furthermore, high resolution displays designed for high performance, e.g., many gray levels and broad temperature operation, require a pixel storage capacitor for enhanced display operating margin. Fabrication of the pixel storage capacitor buss makes the processing more complex and increases cost.

Thus, a need exists for AMLCD pixel and transistor design that provide a high snapback voltage, high pixel aperture ratio, reduced photoconductivity problems, simplified pixel storage capacitor function and simplified processing that is compatible with conventional high temperature CMOS IC processes and provides a body contact or tie for the SOI transistor.

SUMMARY OF THE INVENTION

The present invention solves these and other needs by providing a transistor panel used for active matrix display devices and including islands of single crystal silicon arranged in rows and columns, with a transistor formed in each island. Each transistor includes source, drain and channel regions and an isolated reference voltage region. A pixel electrode is connected to the drain of each corresponding transistor. A control signal line is connected to the gate electrode and a data signal line is connected to the source region of each of the transistors. A metallization extends to each transistor and is in contact with each reference voltage region to form a body tie buss.

It is thus an object of the present invention to provide a novel TFT and pixel design by employing a unique body tie arrangement that dramatically increases the snapback voltage of the SC-Si TFT's.

It is further an object of the present invention to provide a novel TFT and pixel design by employing a unique body tie arrangement that dramatically increases the aperture ratio of the AMLCD.

It is further an object of the present invention to provide such a novel TFT and pixel design in which the body tie acts as a sink for the photo current and obviates the need for a separate light shield layer.

It is further an object of the present invention to provide such a novel TFT and pixel design in which the body tie arrangement not only provides a means for the body contact but also serves as the common electrode of the pixel storage capacitors.

It is further an object of the present invention to provide such a novel TFT and pixel design employing a unique body tie arrangement that is fabricated by using simplified processing that is compatible with high temperature CMOS IC processes.

BRIEF DESCRIPTION OF THE DRAWINGS

FIGS. 5a–5e show plan views of certain process steps in the fabrication of a pixel with an NMOS transistor of FIG. 3.

DETAILED DESCRIPTION

Figure 1:
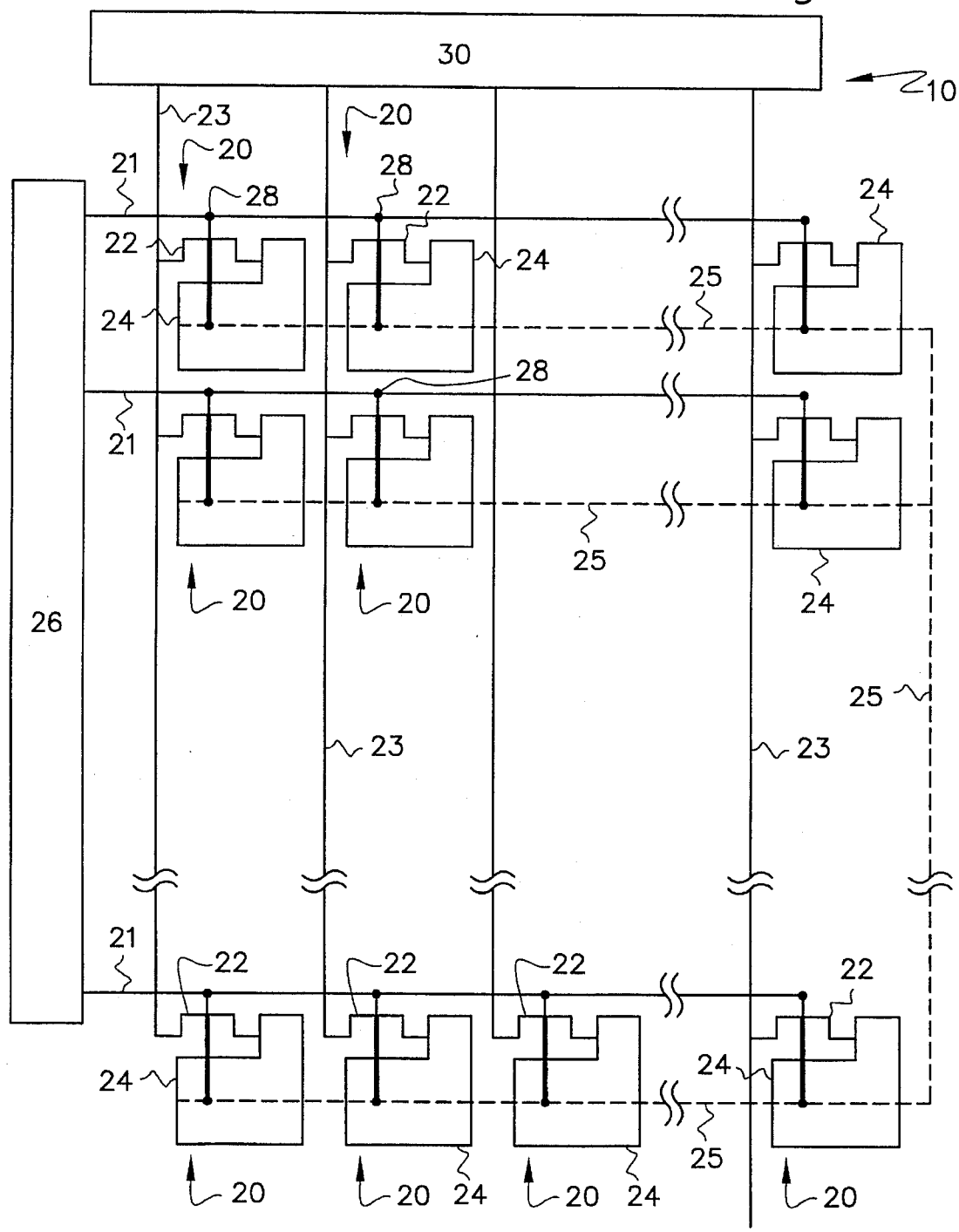
FIG. 1 shows schematically and in simplified block diagram from a liquid crystal matrix display device in accordance with the present invention.

FIG. 1 shows a TFT panel 10 used for active matrix display devices, including a matrix of individual AMLCD pixels 20 with their individual NMOS transistors 22 and their individual associated pixel electrodes 24 as used in an AMLCD. Such an AMLCD would typically be driven a line at a time. Row driver 26 connects through a row conductor 21 the gates 28 of all transistors 22 within a row simultaneously. When gates 28 within a row are turned on, then column driver 30 provides data simultaneously to all the transistors within a row through column conductor 23. Row driver 26 then connects the gates of the next row and the process is repeated, typically at a repetition rate of 60 Hz.

Figure 1A:
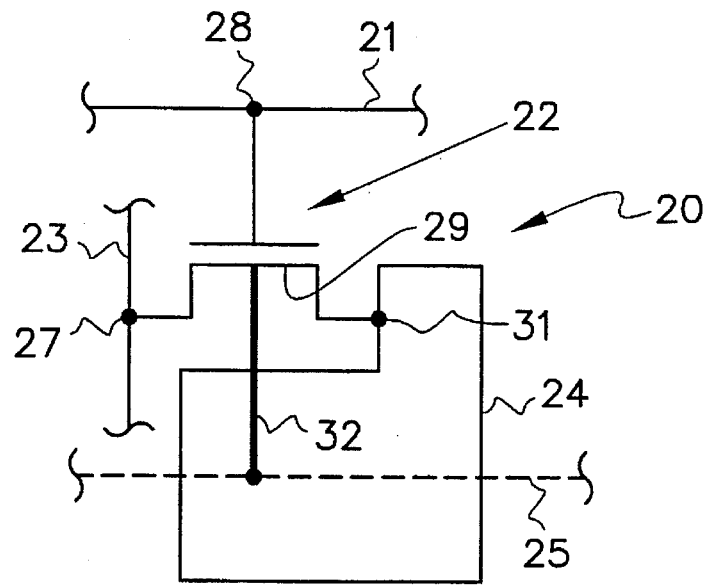
FIG. 1a is an enlarged view of a portion of FIG. 1.

In accordance with the present invention, a body tie buss 25 is represented by the broken line of FIG. 1. Body tie buss 25 is electrically connected by 32 to the body of the NMOS transistor at each AMLCD pixel 20 as shown in the enlarged view of a single pixel in FIG. 1a. The body of the NMOS transistors in the row and column drivers are connected to a separate body tie buss (not shown) to which a separate reference voltage or negative power supply will be connected.

Figure 2:
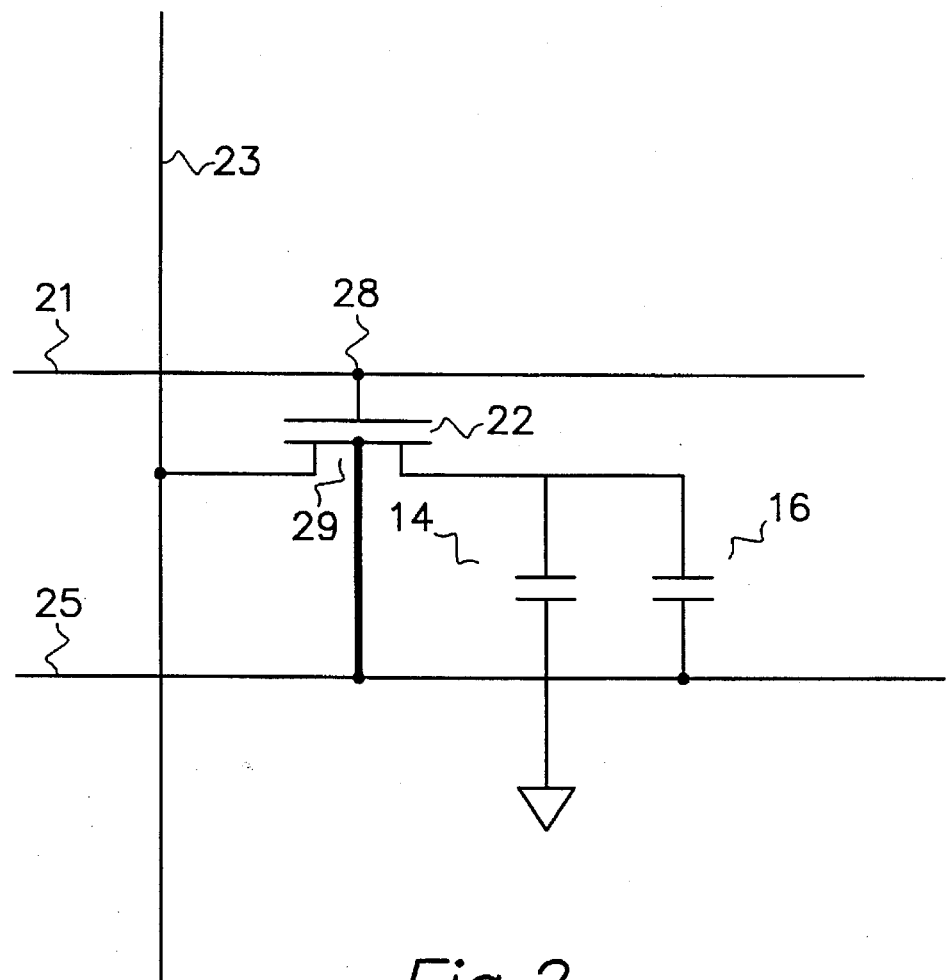
FIG. 2 is an electrical schematic of an AMLCD pixel according to the present invention.

FIG. 2 illustrates the electrical schematic of the AMLCD pixel 22 according to the present invention. The liquid crystal pixel is represented by the capacitor 14 ($C_{lc}$). The storage capacitor is represented by 16 ($C_s$). $C_s$ is parallel to $C_{lc}$ and is defined by the overlap of the body tie buss 25 (TM1) and the pixel electrode 24 (TM2), and the dielectric in between them. Thus, the body tie buss 25 forms the common electrode of all the pixel storage capacitors. The liquid crystal capacitance is defined by the overlap of the pixel electrode (TM2) and the common electrode TM3 on the opposing glass substrate of the LCD structure as shown in FIG. 3.

Figure 3:
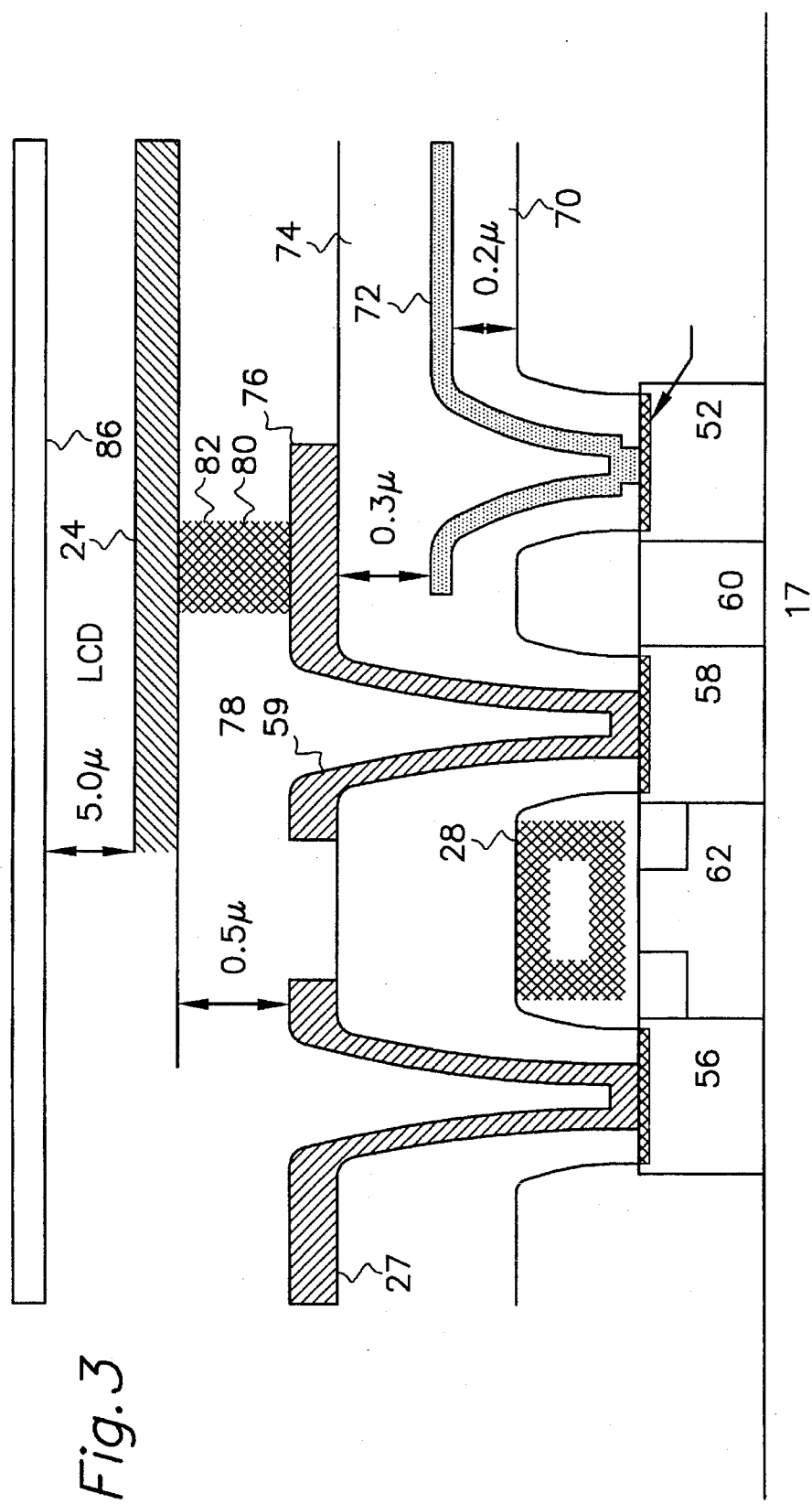
FIG. 3 shows a sectional view of an assembled display in the region of a pixel with an NMOS transistor in accordance with the present invention.

FIG. 3 shows a sectional view of one pixel of thin film transistor panel 10 with an NMOS transistor formed on transparent quartz substrate 17 and including source 56, drain 58 and channel 62 regions. Row conductor 21 would be connected to gate 28 and column conductor 23 would be connected to source connector contact 27. Drain region 58 is connected through contact 59 and tungsten plug 82 to pixel electrode 24 (TM2). First transparent metal TM1 is connected to pixel reference voltage region 52 which, through isolation region 60 forms a body tie to channel region 62.

The present invention preferably utilizes silicon on quartz (SOQ) wafers. The details of the preparation of SOQ wafers are described in U.S. Pat. No. 5,258,323, having the same assignee as the present application and U.S Pat. No. 5,258,323 is hereby incorporated by reference.

Figure 4A:
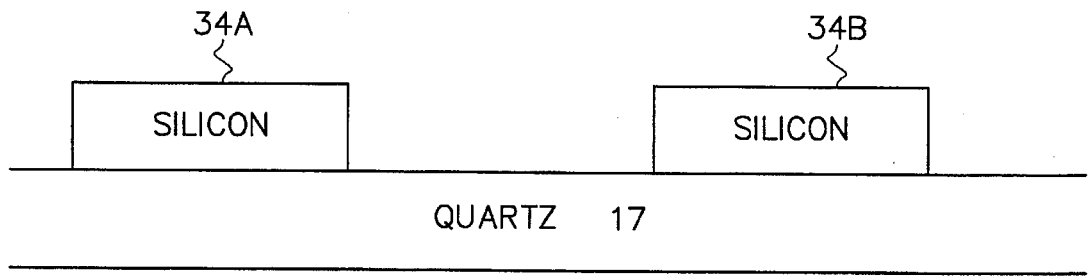
FIGS. 4a–4g show sectional views of the CMOS fabrication process according to the method of the present invention.
Figure 4B:
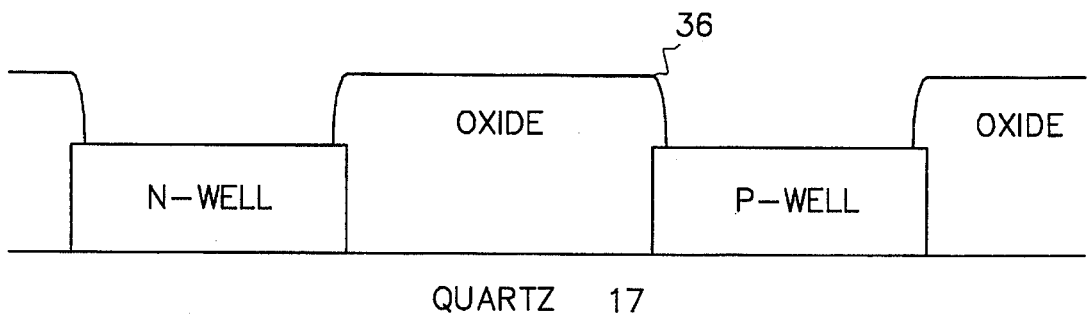

The fabrication of the AMLCD of the present invention is described as follows. To begin, SOQ wafers with a typical silicon thickness of 3000 angstroms are prepared according to the method of U.S. Pat. No. 5,258,323. As shown in FIG. 4a, silicon islands 34 are defined by an island cut mask (Mask #1) and etched. The size of the silicon islands may be anywhere from a centimeter on the side to the size of a single transistor depending upon whether it is in the pixel array region or the row and column driver region. The largest island size to be used is determined by the thermal stress considerations (see U.S. Pat. No. 5,258,323). The spacing between the islands is again determined based upon whether it is in the driver area or pixel area. While the pixel pitch determines the spacing in the pixel area, minimum spacing may be used in the driver area. High mobility integrated drivers for AMLCD's are described in U.S. Pat. No. 5,281,840 having the same assignee as the present application and U.S. Pat. No. 5,281,840 is hereby incorporated by reference. The wafers are then oxidized at 950° C. in dry oxygen for ½ hour to establish good bonding. A boron doped silicon dioxide layer of 5000 angstroms is then CVD deposited and annealed at 800° C. for 1 hour. A thick photoresist is spun on and baked, a pattern is defined through the use of a reverse island mask (Mask #2) and the boron doped silicon dioxide is etched back. Another coat of photoresist is applied without a mask and etched to achieve better planarization. The wafer with silicon islands 34 and isolation 36 (FIG. 4b), is now ready for SOQ CMOS fabrication.

Fabrication of SOQ CMOS

Figure 4C:
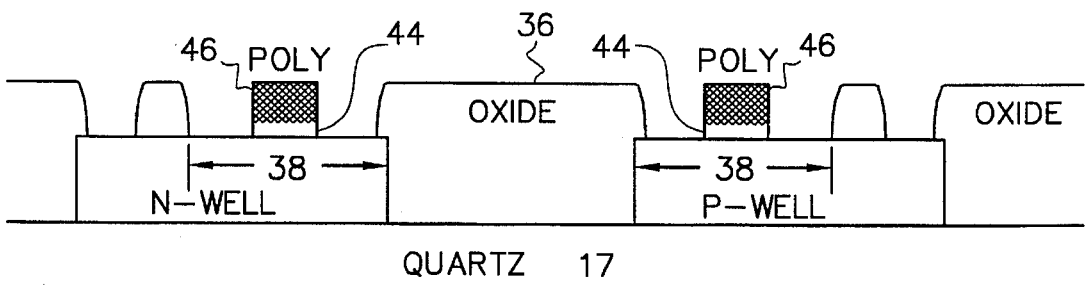

After silicon islands 34 and isolation structures 36 have been prepared, one proceeds with the sequence of CMOS fabrication. In the following, the preferred method of fabrication will be described. However, many of the individual steps in the fabrication sequence are conventional. The next step is to use the conventional LOCOS (local oxidation process) technique to define device isolation 36 after an oxide growth, a buffered polysilicon layer and a CVD nitride deposition. The active MOS region 38 is defined by the field cut (Mask #3). After etching nitride in the field region, field oxide is grown. Then, after stripping the nitride, the polysilicon, and the oxide from the active area, a thin 200 angstrom pad oxide is grown. The p-well is then cut (Mask #4) and implanted with boron for the well and threshold voltage adjustment for NMOS transistors. Then the n-well is cut (Mask #5) and implanted with phosphorous for the well and adjusted with a shallow boron implant for the PMOS transistor threshold voltage control. Then the pad oxide is removed. Gate oxide 44 of 400 angstrom is then grown, followed by a 5000 angstrom polysilicon deposition 46. The next step is the gate cut (Mask #6) and polysilicon etch (FIG. 4c).

Figure 4D:
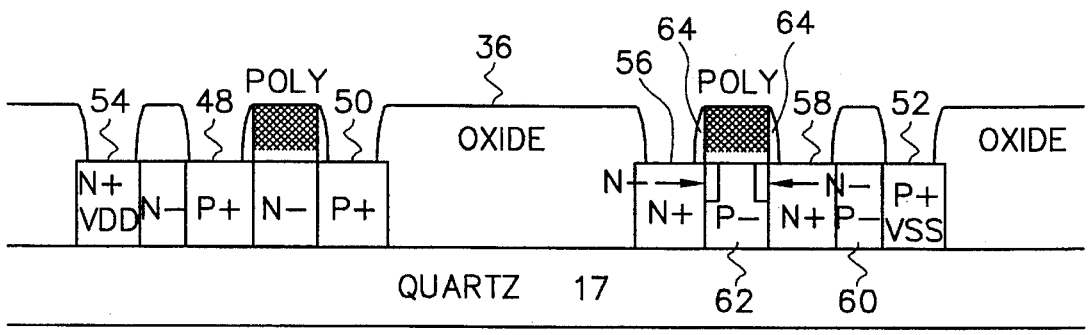
Figure 4E:
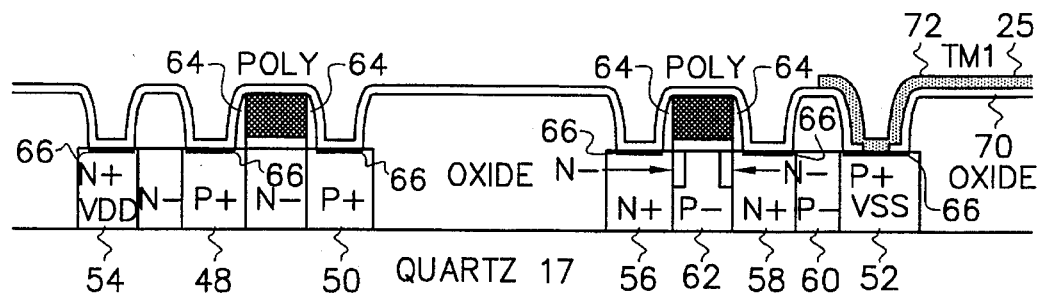

To improve the breakdown and snapback voltage of NMOS transistors, LDD (low donor doping) implant is used in conjunction with Mask #7. And then the p+ regions 48, 50 and 52 are cut (Mask #8), and it is followed by heavy boron implant at the dose level of 2E15 cm$^{-2}$ at 15 KeV. Next, the n+ regions 54, 56 and 58 are cut (Mask #9) and implanted with a heavy phosphorous implant with the dose of 1E15 cm$^{-2}$ at 30 KeV. About 2300 angstroms of oxide layer is CVD deposited and etched to provide spacers 64 (FIG. 4d) to facilitate the silicidation of sources/drains and gate polysilicon with titanium silicide 66 to reduce the resistances. Polysilicon, even though heavily doped with phosphorous (n+), has a resistance of 50 Ohms per square; the silicide will reduce the interconnection resistance to a few ohms per square. After the silicidation process is completed, a doped oxide layer 70 of 2000 angstrom is deposited, densified, and then via cut (Mask #10) and etched. This via contact is provided for body-tie to the first transparent metal layer 72 (TM1). TM1 is connected to pixel reference voltage (Vss) at 52. P+ region 52 is connected to channel region 62 by body tie 60 of P− conductivity. First transparent metal 72 (TM1) for all pixels 20 are connected together through body tie buss 25 (FIG. 4e). This body tie buss also serves as a pixel storage capacitor buss.

Figure 4F:
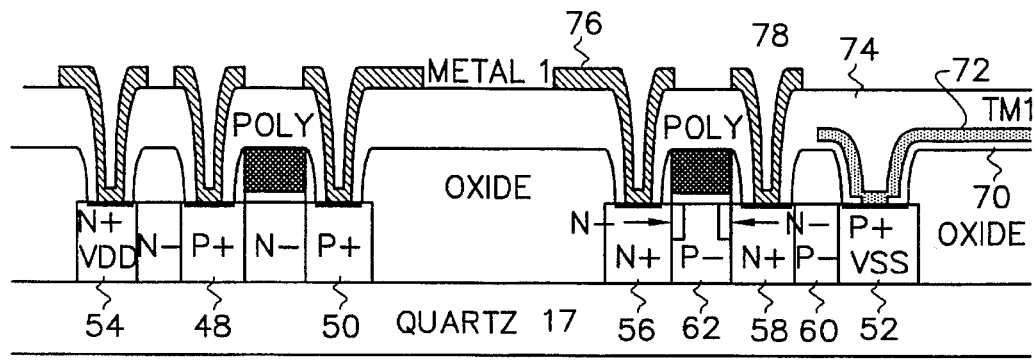

After the transparent metal is deposited and cut (Mask #11), another doped oxide layer 74 of 3000 angstrom is then deposited and cut (Mask #12) for making contacts to sources/drains and gates. After etching the contacts, the regular first metal 76 (Metal 1) layer is deposited and defined (Mask #13). After the metal layer 76 is etched, another doped oxide layer 78 of 5000 angstrom is deposited (FIG. 4f). Vias 80 are opened by VIA cut (Mask #14) to provide for the tungsten plug 82 for connecting the first metal 76 to the second transparent metal TM2. The tungsten plug 82 is prepared by CVD tungsten deposition followed by planarization. Then second transparent metal TM2 is deposited, patterned and etched (Mask #15). After etching, second transparent metal TM2 defines the pixel electrode 24 of FIG. 1a. Indium Tin Oxide (ITO) is used as a transparent metal. The fabrication sequence up to this point (FIG. 4g) completes the fabrication of the active matrix substrate with the integrated row and column drivers.

Figure 4G:
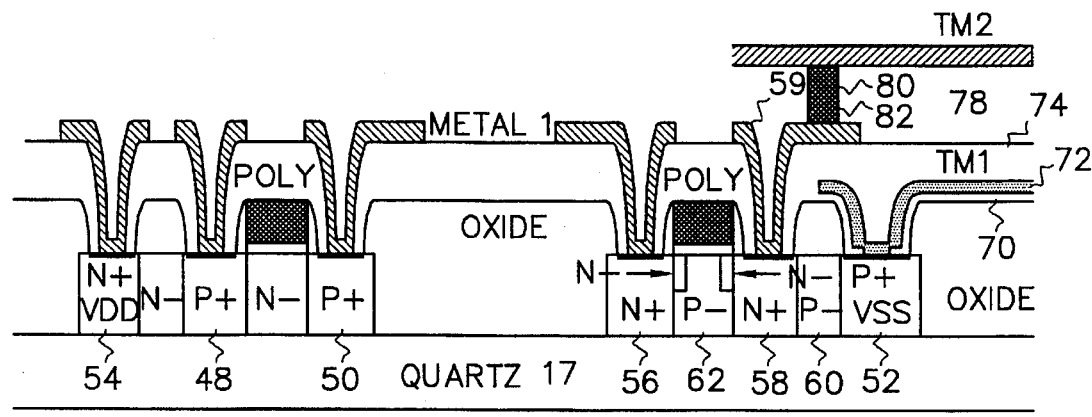

Then the active matrix substrate shown in FIG. 4g is assembled into an AMLCD using another glass substrate with a third transparent metal layer 86, by employing standard LCD assembly techniques. FIG. 3 shows a schematic cross-section through an assembled display in the region of a pixel. The quartz substrate with the active matrix pixel array and the integrated drivers, and the glass substrate with a common electrode 86 (TM3) sandwich a liquid crystal layer that has a typical thickness in the range of 5 microns. This completes the fabrication of an AMLCD according to the invention. Certain additional details of the fabrication of pixel 20 are shown in the plan views of FIGS. 5a–5e.

FIG. 5a shows an silicon island in which N+ source 56 and N+ drain 58 will be formed. Also shown is P+ pixel reference voltage region 52 and P− body tie silicon portion 60 which are interconnected at 61.

FIG. 5b shows the addition of row conductor 21 which is connected to gate 28.

FIG. 5c shows connections to source 56 and drain 58. Also shown is first transparent metal 72 (TM1) and its connection to pixel reference voltage or P+ region 52.

FIG. 5d shows column conductor 23 connected to source 56. Also shown is first transparent metal 72 (TM1) which is connected to pixel reference voltage region 52.

FIG. 5e shows regular first metal 76 and tungsten plug 82 connecting first metal 76 to second transparent metal TM2.

Now that the basic fabrication process for thin film transistor panel 10 has been described, certain advantages may be set forth and appreciated.

The unique body tie design of the NMOS transistor and the body tie buss will allow a display operating voltage of at least 15 volts for a 2 micron gate length design.

In the past, AMLCD transistor panels have required a light shield to reduce the photoelectric current due to incident light on the transistors which generated electron-hole pairs in the channel region. The present invention provides a body tie from the channel region of the NMOS transistor to the pixel reference voltage which allows photocurrents to be extracted from the channel region through the body tie.

Figure 6:
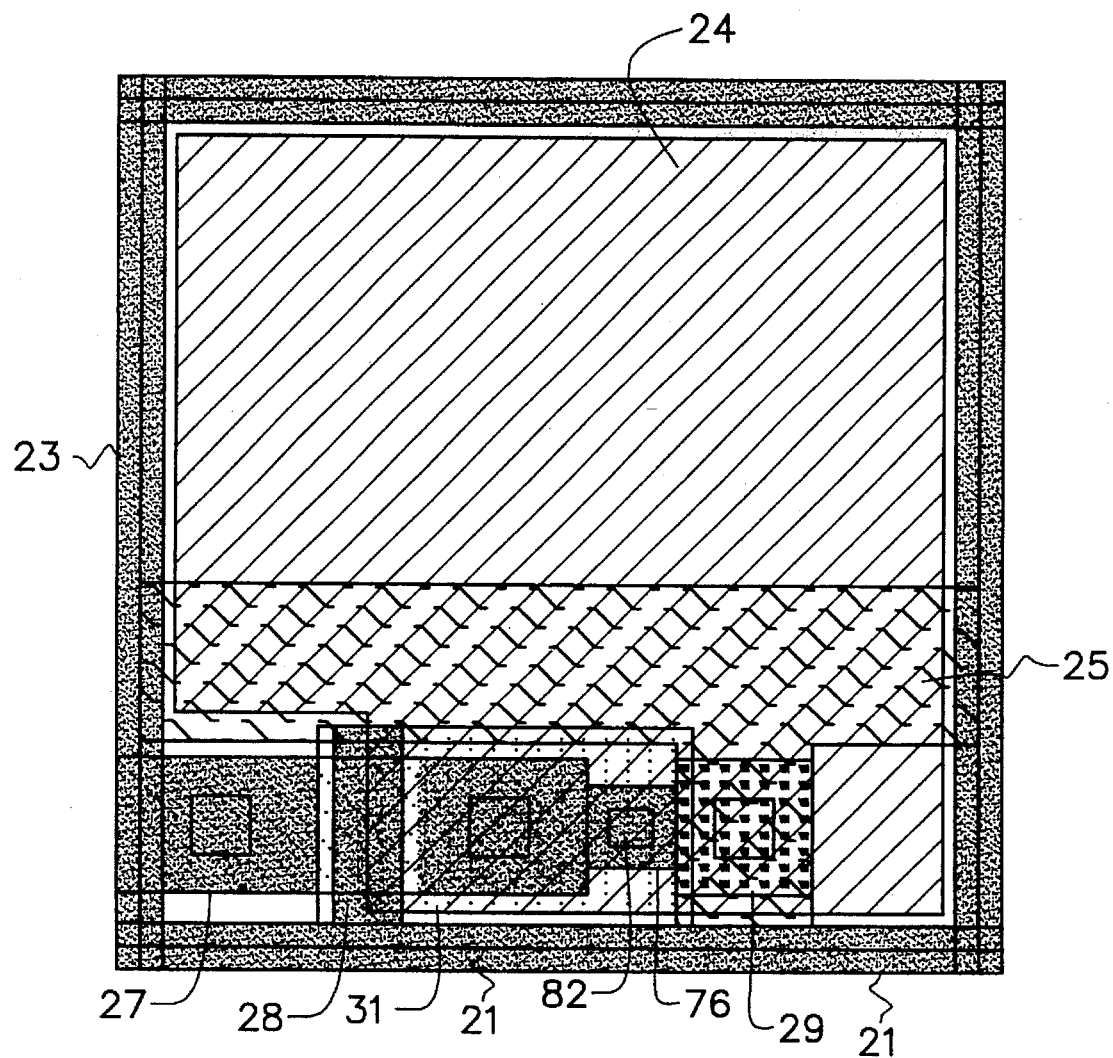
FIG. 6 shows an enlarged plan view of a pixel according to the present invention.

Also, high performance AMLCD's require a pixel storage capacitor. With reference to FIG. 2 and FIG. 6, a body tie buss 25 which overlaps pixel electrode 24 and is separated from electrode 24 by oxide layers 74 and 78 is shown. The size of body tie buss 25 is selected to provide a desired storage capacitor value.

In addition, AMLCDs of the past have typically had aperture ratios of less than 30%. This is partly due to the light shield requirement. The present invention will achieve an aperture ratio of approximately 60% for 2 micron design rules and an aperture ratio greater than 70% for 1 micron design rules for a display with 25 micron pixel size. The high aperture ratio allows use of a lower power backlight and improves the display brightness and efficiency.

Furthermore, the AMLCDs of the past were often built at low temperatures due to the low temperature process requirements of the conventional transparent substrate. The single crystalline silicon film on the high temperature transparent quartz substrate eliminates these limitations and allows normal high temperature silicon processing.

It should be noted that the process description presented above is for illustrative purpose only and many process variations can be employed without deviating from the spirit of the invention. The scope of the invention is to be indicated by the appended claims rather than the foregoing description.

We claim:

1. A thin-film transistor panel used for active matrix display devices, comprising:

a transparent insulative substrate;

a plurality of islands of single crystal silicon formed on said insulative substrate and arranged in rows and columns;

an NMOS transistor formed in each said island and having source, drain and channel regions, said source and drain regions of a first conductivity type, said transistor having a gate electrode at said channel region and source and drain electrodes, said transistor further having a pixel reference voltage region of a second conductivity type, said second conductivity type opposite said first conductivity type;

a plurality of pixel electrodes spaced from said plurality of transistors with each pixel electrode connected to said drain electrode of a corresponding said first transistor;

a plurality of control signal lines which are formed to extend in a direction of said rows and which connect to said gate electrodes of said transistors in said rows;

a plurality of data signal lines which are formed to extend in a direction of said columns and which connect to said source electrodes of said transistors in said columns;

a silicon body tie connection of a second conductivity type extending from said pixel reference voltage region to said channel region; and a first transparent metallization extending to each said first transistor and in contact with each said pixel reference voltage region, said first metallization forming a body tie buss.

2. Thin film transistor panel of claim 1 wherein said first metallization has a plurality of first areas, each said first area overlapping and spaced from each said corresponding pixel electrode by a dielectric, each said first area having a first size and said first size selected to achieve a first storage capacitor value.

3. Thin film transistor panel of claim 1 wherein an incident light on said transistor results in the generation of electron-hole pairs in said channel region and said silicon connection extracts said electron-hole pairs, thereby obviating the need for a separate light shield for said first transistors.

4. Thin film transistor panel of claim 1 wherein said first NMOS transistor has a snapback voltage of at least 10 volts.

5. Thin film transistor panel of claim 1 wherein said panel has an aperture ratio of at least 60 percent.

6. Thin film transistor panel of claim 1 further comprising integrated high mobility single crystal silicon transistors for use as row and column drivers.

7. A thin-film transistor panel used for active matrix display devices, comprising:

a transparent insulative substrate;

a first plurality of islands of single crystal silicon formed on said insulative substrate and arranged in rows and columns for a pixel switching function;

a second plurality of islands of single crystal silicon formed at the periphery of said insulative substrate for the integrated row and column driver functions;

an MOS transistor formed in each said first plurality island and having source, drain and channel regions, said source and drain regions of a first conductivity type, said transistor having a gate electrode at said channel region and source and drain electrodes, said transistor further having a pixel reference voltage region of a second conductivity type, said second conductivity type opposite said first conductivity type;

a plurality of pixel electrodes spaced from said plurality of transistors with each pixel electrode connected to said drain electrode of a corresponding said first transistor;

a plurality of control signal lines which are formed to extend in a direction of said rows and which connect to said gate electrodes of said transistors in said rows;

a plurality of data signal lines which are formed to extend in a direction of said columns and which connect to said source electrodes of said transistors in said columns;

a silicon body tie connection of a second conductivity type extending from said pixel reference voltage region to said channel region; and a first transparent metallization extending to each said first transistor and in contact with each said pixel reference voltage region, said first metallization forming a body tie buss.

8. Thin film transistor panel of claim 7 wherein said first metallization has a plurality of first areas, each said first area overlapping and spaced from each said corresponding pixel electrode by a dielectric, each said first area having a first size and said first size selected to achieve a first storage capacitor value.

9. Thin film transistor panel of claim 7 wherein an incident light on said transistor results in the generation of electron-hole pairs in said channel region and said silicon connection extracts said electron-hole pairs, thereby obviating the need for a separate light shield for said first transistors.

10. Thin film transistor panel of claim 7 wherein each pixel transistor is of NMOS type.

11. Thin film transistor of claim 10 wherein said first NMOS transistor has a snapback voltage of at least 10 volts.

12. Thin film transistor panel of claim 9 wherein each pixel transistor is of PMOS type.

13. Thin film transistor panel of claim 7 wherein said panel has an aperture ratio of at least 60 percent.

14. Thin film transistor panel of claim 7 wherein each of said second plurality of islands of single crystal silicon comprises both NMOS and PMOS transistors for CMOS integrated row and column driver functions.

* * * * *